United States Patent [19]

Okayama et al.

[11] Patent Number: 5,278,846
[45] Date of Patent: Jan. 11, 1994

[54] DIGITAL SIGNAL DECODER

[75] Inventors: Mutsuyuki Okayama, Kobe; Haruo Ohta, Hirakata, both of Japan

[73] Assignee: Matsushita Electric Industrial Co., Ltd., Osaka, Japan

[21] Appl. No.: 712,037

[22] Filed: Jun. 7, 1991

[30] Foreign Application Priority Data

Jun. 11, 1990 [JP] Japan .................. 2-151934

[51] Int. Cl.$^5$ .............................. H04B 1/10
[52] U.S. Cl. .................... 371/37.1; 371/37.7
[58] Field of Search ............... 371/6, 37.1, 37.2, 37.7, 371/50.1, 38.1

[56] References Cited

U.S. PATENT DOCUMENTS 4,849,974  7/1989  Schilling et al. ............ 371/50.1
4,967,413  10/1990  Otani ...................... 371/37.7

FOREIGN PATENT DOCUMENTS 63-87826  4/1988  Japan .
2-146820  6/1990  Japan .

Primary Examiner—Vincent P. Canney
Attorney, Agent, or Firm—Wenderoth, Lind & Ponack

[57] ABSTRACT

A decoder for product codes includes a received symbol reliability detector for detecting the reliability of each erase-flag-carrying symbol produced by a row code decoder, and an erase flag adjuster for eliminating the erase flag of a particular symbol which has a higher reliability than a predetermined reference value among erase-flag-carrying symbols supplied from a row code decoder in accordance with a data output of a received symbol reliability detector.

1 Claim, 4 Drawing Sheets

DIGITAL SIGNAL DECODER

BACKGROUND OF THE INVENTION

1. Field of the Invention

The present invention relates to a digital signal decoder for receiving or reproducing data using an error correction code having a multiple coding arrangement.

2. Description of the Prior Art

Although the procedure of recording data is not directly associated with the scope and spirit of the present invention, it will briefly be explained for ease of understanding.

The procedure starts with arranging digital data into a two-dimensional array (an lxk symbol array, where l and k are integers) with a column code encoder. Each of the k columns of the array is encoded by an error correction routine to produce mxk array codes. Then, each of the m rows are error correction encoded with a row code encoder to produce mxn array codes which are in turn modulated by a modulator prior to storage in a recording medium.

The procedure of retrieving a data from recorded signals is explained as follows. A reproduced signal from the recording medium is fed to a demodulator where it is demodulated into digital data. The digital data is transferred to a row code decoder where row code components of the data are decoded. More particularly, each of the m rows of the array data is decoded by t-tuple error correction and s-tuple error detection routines (where t and s are integers satisfying t<s) to produces mxk codes. In decoding, if more than s error symbols are found in one row of the data, an erase flag is set up indicating that all of the symbols of the row have errors. The resultant erase-flag-carrying data is then fed to a column code decoder where each of the k columns of the data is decoded by u-tuple error correction and v-tuple erase correction routines (where u and v are integers) to produce lxk array data. More specifically, the column code decoder performs decoding with u-tuple error correction and v-tuple erase correction routines while identifying the location of each error symbol accompanied by an erase flag given by the row code decoder. As a result, reproduced data in which errors have been corrected will be acquired. One of such techniques of error correction is depicted in "Error control coding fundamentals and applications" (Prentice-Hall) by Shu Lin and D. J. Costello Jr.

However, the disadvantage of the foregoing technique is that if the number of error rows with erase flags is more than n+v+1, the column code decoder will fail to perform error correction, thus providing no appropriate decoding. In the common practice of the row code decoder, erase flags are assigned to all of the symbols of a corresponding row which contains one or more error symbols and hence, correct symbols of the row are also decorated by erase flags. As a result, even if one column contains less than u error symbols, it is systematically judged by the column code decoder that the column carries more than u+v+1 of error symbols and correctable error symbols will be left uncorrected. In short, the error correction in a two-dimensional array code data will be conducted without success.

SUMMARY OF THE INVENTION

It is an object of the present invention to provide a digital signal decoder in which the efficiency in decoding of column codes is improved by reducing the number of undesirably erased symbols and thus, the error rate will be minimized.

For achievement of the foregoing object, a digital signal decoder according to the present invention comprises: a received symbol reliability detector for detecting the reliability of each erase-flag-carrying symbol which is produced by a row code decoder using data and control signals from a signal detector; and an erase flag adjuster for eliminating the erase flag of each particular symbol which has a higher reliability than a predetermined reference value among erase-flag-carrying symbols supplied from the row code decoder in accordance with a data output of the received symbol reliability detector.

As set forth above, a particular one of the erase-flag-carrying symbols, which has a lower reliability value than the predetermined reference, is designated as an error symbol. Hence, columns in which column codes can be decoded are increased even when the number of erase flag containing rows is more than n+v+1. Most of the error symbols which are not corrected in the prior art can thus be corrected and the error rate will be minimized.

DESCRIPTION OF THE PREFERRED EMBODIMENTS

Preferred embodiments of the present invention will be described in the form of a digital signal decoder referring to the accompanying drawings.

Figure 1:
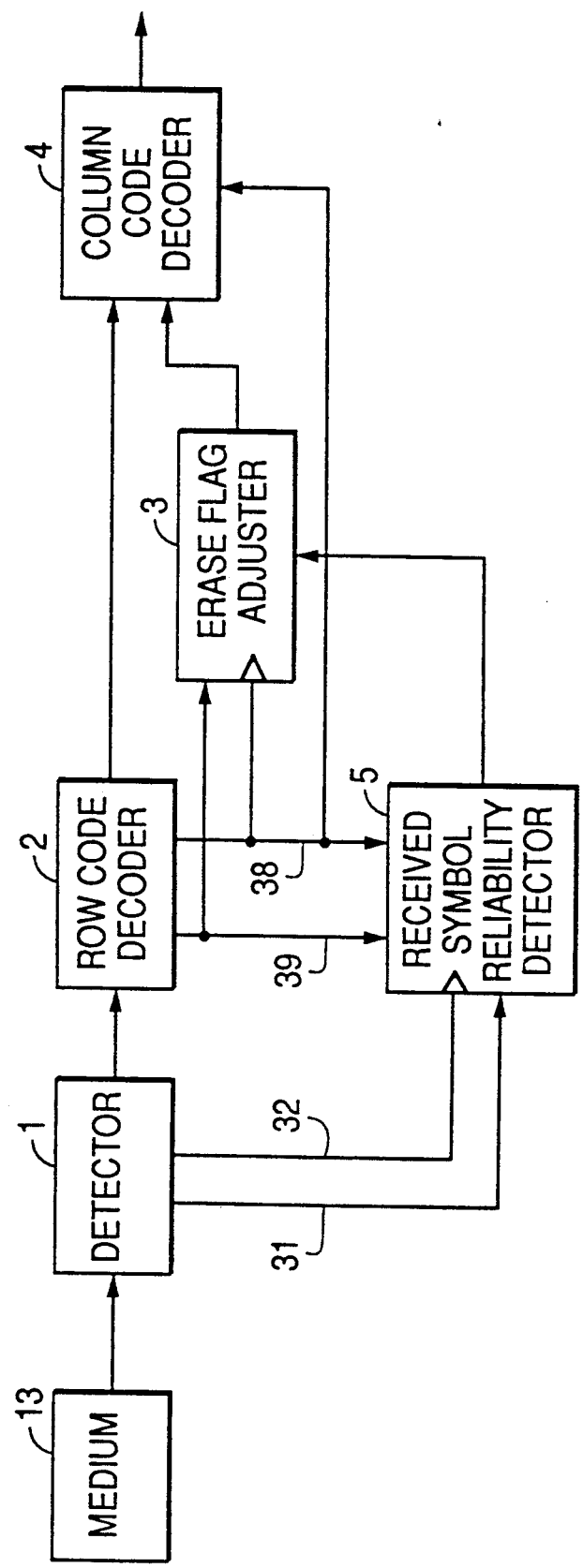
FIG. 1 is a block diagram of a signal processor in a digital signal receiver apparatus showing a first embodiment of the present invention.
Figure 3:
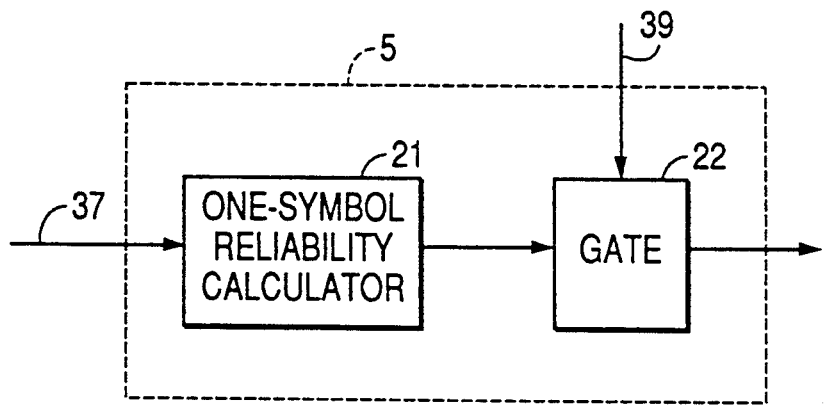
FIG. 3 is a block diagram of a received symbol reliability calculator in the first embodiment of the present invention.
Figure 4:
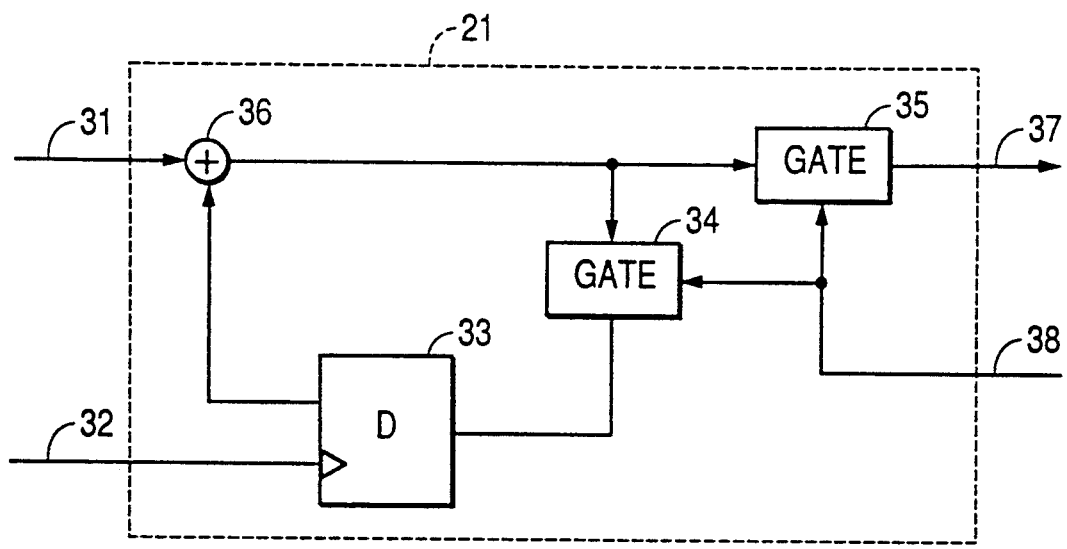
FIG. 4 is a block diagram of a one-symbol reliability calculator of the first embodiment.
Figure 5:
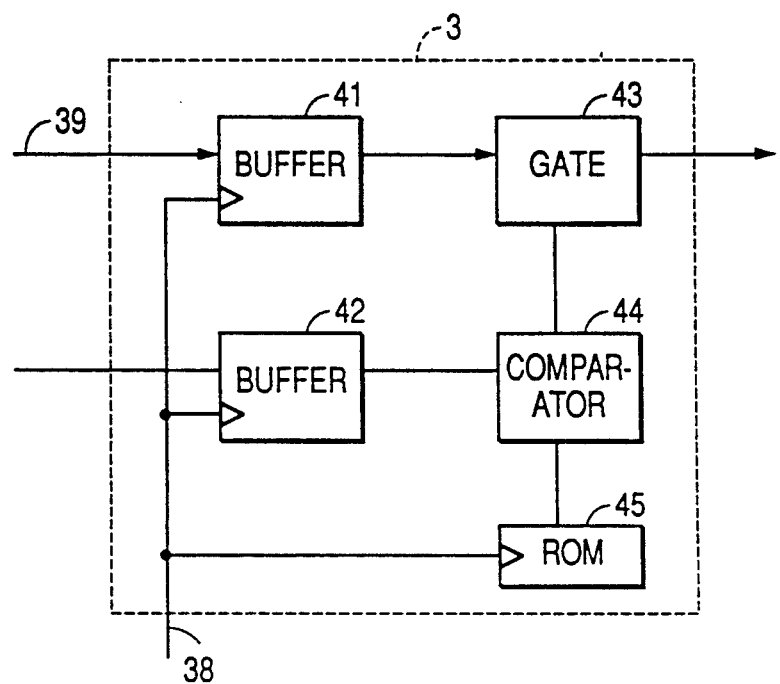
FIG. 5 is a block diagram of an erase flag adjuster of the first embodiment.
Figure 6:
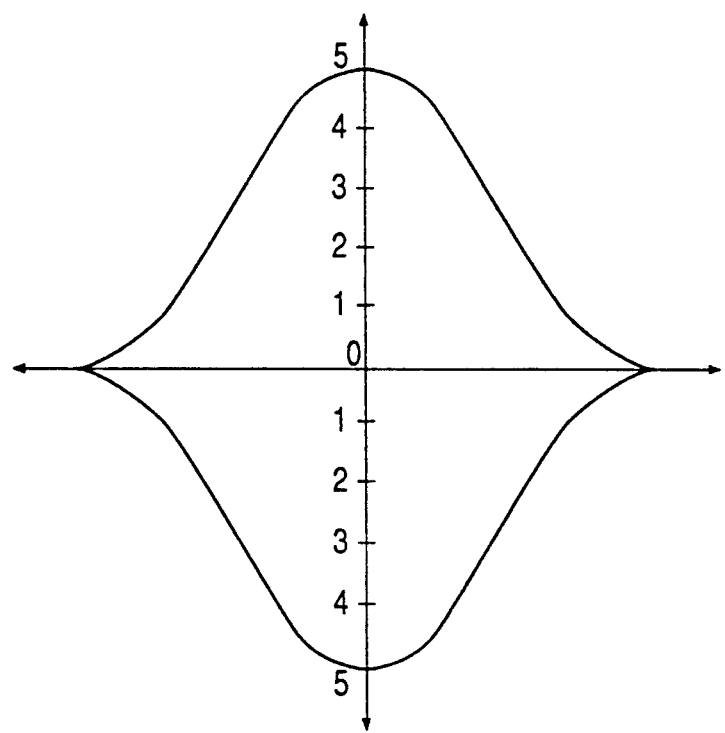
FIG. 6 is a diagram showing an eye pattern associated with the first embodiment.

FIG. 1 is a block diagram showing a signal processor in the digital signal decoder of a first embodiment of the present invention. FIG. 1 illustrates a recording medium 13, a signal detector 1, a row code decoder 2, an erase flag adjuster 3, a column code decoder 4, a received symbol reliability detector 5, one-bit reliability data 31, a one-bit extracting clock signal 32, a one-symbol extracting clock signal 38, and erase flag data 39. FIG. 3 is a block diagram of the received symbol reliability detector shown in FIG. 1. FIG. 4 is a block diagram of a one-symbol reliability calculator 21, shown in FIG. 3, of the received symbol reliability detector 5. FIG. 5 is a block diagram of the erase flag adjuster shown in FIG. 1. FIG. 6 illustrates an eye pattern of a signal in the signal detector shown in FIG. 1.

The operation of the digital signal decoder having the foregoing arrangement will now be described, referring to FIGS. 1, 3, 4, 5, and 6.

The procedure of recording data is similar to that of the prior art and will not be further explained. In brief, a data consisting of 1 rows and k columns is row and column encoded to m×n array codes. Also, the signal detector 1, the row code decoder 2, and the column code decoder 4 are explained in more detail in the previously mentioned literature and "Theory and practice of error control" (Addison-Wesley) by R. E. Blahut with relevant diagrams and will be not be further described.

A waveform modulated signal corresponding to the original data is fed from the recording medium 13 to the signal detector 1. The waveform is detected by the signal detector 1 which in turn transmits a digital equivalent to the row code decoder 2. The row code decoder 2 allows each of the m rows of the digital data to be decoded by means of t-tuple error correction and s-tuple error detection routines (where both t and s are integers satisfying t<s) and produces m×k array codes. If any row of the digital data carries more than s error symbols, an erase flag is given to the row indicating that all of the symbols of the row are incorrect. Then, the row code decoder 2 delivers the m×k code data produced by row coding, together with a one-symbol extracting clock signal, to the column code decoder 4 and also, erase flag data and a one-symbol extracting clock signal to the received symbol reliability detector 5 and the erase flag adjuster 3 respectively. Meanwhile, the signal detector 1 while transmitting the digital equivalent to the row code decoder 2 delivers data about the reliability of each bit of the digital equivalent and also, a one-bit extracting clock to the received symbol reliability detector 5. At the received symbol reliability detector 5, its one-symbol reliability calculator 21 calculates, with reference to the reliability of each bit of the digital data, the reliability of each symbol in a corresponding row code which is then transmitted to a gate 22.

One method of calculating the reliability of each symbol of the row code at the one-symbol reliability calculator 21 will be explained, referring to FIG. 4. As shown in FIG. 4, a one-bit reliability data transmission line 31, a clock signal 32, a delayer 33, a pair of gates 34 and 35, an adder 36, a one-symbol reliability data transmission line 37, and a one-symbol extracting clock signal 38 are provided. The operation of the one-symbol reliability calculator 21 having the foregoing arrangement will be described. Along the one-bit reliability data transmission line 31, the data of one-bit reliability is fed in the form of amplitude values of an eye pattern which are best shown in FIG. 6. More specifically, the vertical axis of FIG. 6 represents the reliability ranked in five levels. The one-bit reliability data is transferred to both the gates 34 and 35. Simultaneously, the row code decoder 2 delivers clock signals for extraction of one symbol to the gates 34 and 35. The gate 34 is arranged to disconnect the circuit upon receiving a one-symbol extracting clock and if not, allows the circuit to be connected. The gate 35 is arranged to connect the circuit upon receiving a one-symbol extracting clock and if not, allows the circuit to remain disconnected. It is now assumed that one symbol contains N bits. The delayer 33 which is activated by the one-bit extracting clock signal 32 allows N bits of the one-bit reliability data to pass therethrough and are transmitted to the adder 36 for addition. As the two gates 34 and 35 carry out the foregoing actions, the one-symbol reliability data is passed through the gate 35 and delivered from the one-symbol reliability data transmission line 37. In this manner, the one-symbol reliability data is transferred from the one-symbol reliability calculator 21 to the gate 22. The gate 22, which receives the one-symbol reliability data from the one-symbol reliability calculator 21 and the erase flag signal from the row code decoder 2, passes signals therethrough when an erase flag is detected and prevents the passage of signals when no erase flag is present. Accordingly, the received symbol reliability detector 5 calculates the reliability of each symbol accompanied by an erase flag upon receiving both one-bit reliability data from the signal detector 1 and erase flag data from the row code decoder 2 and then, transmits a resultant value to the erase flag adjuster 3.

The operation of the erase flag adjuster 3 will then be described referring to FIG. 5. As shown in FIG. 5, erase flag data 39, a pair couple of buffers 41 and 42, a gate 43, a comparator 44, and a ROM 45 are provided. The operation of the erase flag adjuster 3 having the foregoing arrangement is explained as follows. Erase flag data from the row code decoder 2 is fed to the buffer 41 and a received symbol reliability data from the received symbol reliability detector 5 is fed to the buffer 42. Both the buffers 41 and 42 are activated by the one-symbol extracting clock signal. The one-symbol extracting clock signal is also supplied to the ROM 45. The ROM 45 is arranged to deliver a decision value for assessing the received symbol reliability. In operation, the comparator 44 compares the decision value supplied from the ROM 45 with the reliability of the erase flag carrying symbol transferred from the buffer 42. If the one-symbol reliability is greater than the decision value, it is determined that the corresponding symbol has far less possibility of error and then, no pulse signal is fed to the gate 43. If smaller, it is determined that the symbol has error at high probability and a pulse is supplied to the gate 43. When the gate 43 is connected upon receiving the pulse signal from the comparator 44, the erase flag associated with the one-symbol reliability which is smaller than the decision value can pass across the gate 43 to the column code decoder 4. Accordingly, the erase flag adjuster 3 eliminates the erase flag carried in a false error symbol which exhibits a higher reliability than a predetermined reference value and transmits the erase flag carried in a true error symbol which has a lower reliability than the reference value to the column code decoder 4. When receiving the digital data from the row code decoder 2 and the erase flag data from the erase flag adjuster 3, the column code decoder 4 performs decoding of the m×k data with u-tuple error correction and v-tuple erase correction routines (where both u and v are integers) and produces l×k array codes of digital form.

As set forth above, the first embodiment of the present invention comprises a received symbol reliability detector for detecting the reliability of each symbol of a row code supplied from a signal detector and an erase flag adjuster which in accordance to a data from the received symbol reliability detector, accepts the erase flag carried on each of the error symbols which has a lower reliability than a predetermined reference value while the erase flags have been set up by a row code decoder. Hence, most of true error symbols which are not corrected by a column code decoder in the prior art will be corrected, thus minimizing the error rate. Although the first embodiment is a playback device, it may successfully be provided in the form of a receiver while the recording medium is replaced by a transmission line.

Figure 2:
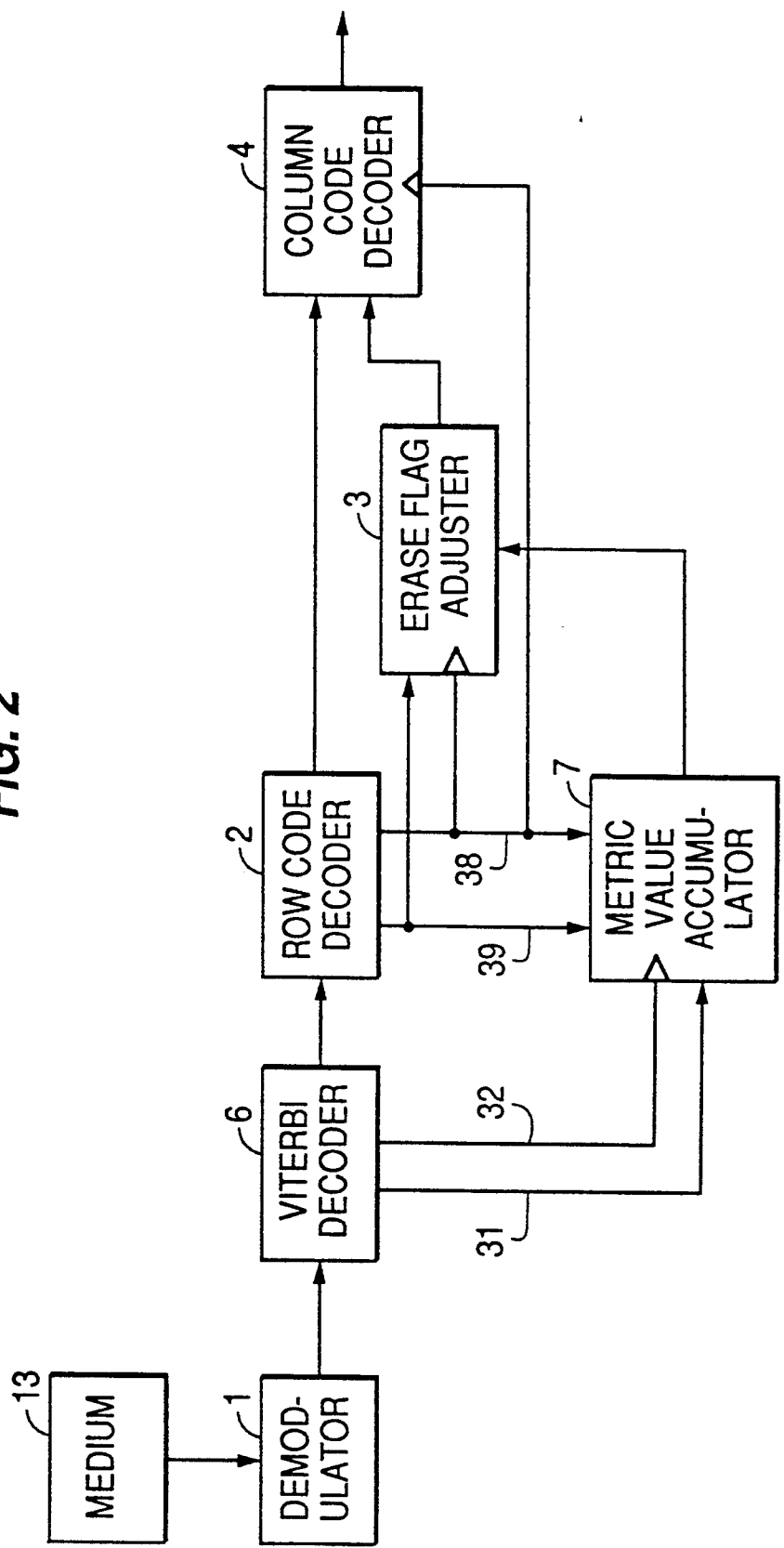
FIG. 2 is a block diagram of a signal processor in a digital signal playback apparatus showing a second embodiment of the present invention.

FIG. 2 is a block diagram of a signal processor in a digital signal decoder showing a second embodiment of the present invention. Illustrated in FIG. 2 are a recording medium 13, a demodulator 1, a row code decoder 2, an erase flag adjuster 3, a column code decoder 4, a metric value accumulator 7, one-bit reliability data 31, a one-bit extracting clock signal 32, a one-symbol extracting clock signal 38, and erase flag data 39, which all are similar to those shown in FIG. 1. The arrangement of FIG. 2 which is different from that of FIG. 1 contains a Viterbi decoder 6 for decoding digital codes with the Viterbi decoding technique.

The operation of the digital signal decoder having the foregoing arrangement will be described referring to FIG. 2.

A playback signal reproduced from the recording medium 31 is fed to the demodulator 1 where it is detected and demodulated into a digital code data. The digital code data is then transferred to the Viterbi decoder 6 where it is decoded and further transmitted to the row code decoder 2. At the row code decoder 2, the decoded digital data from the Viterbi decoder 6 is arranged into a two-dimensional, mxn, array and each of the m rows is decoded by means of t-tuple error correction and s-tuple error detection routines (where t and s are integers satisfying t<s). Each symbol of the row where an error is detected is accompanied by an erase flag. Then, the row code decoder 2 delivers the mxk code data produced by row coding, together with a one-symbol extracting clock signal, to the column code decoder 4 and also, an erase flag data and a one-symbol extracting clock signal to the metric value accumulator 7 and the erase flag adjuster 3 respectively. Meanwhile, the Viterbi detector 6 while transmitting the digital data to the row code decoder 2 delivers data about reliability of each bit of the digital data and a one-bit extracting clock signal to the metric value accumulator 7. Also, the Viterbi decoder 6 calculates the metric value of each digital data and transmits it to the metric value accumulator 7. At the metric value accumulator 7, the metric value of one symbol of each row code is calculated from the metric value of the digital data signal supplied from the Viterbi decoder 6 and then, fed to the erase flag adjuster 3. It is understood that the metric value accumulator 7 is easily arranged by replacing the one-bit reliability data with a metric value in the arrangement of the block diagram of FIG. 1. The erase flag adjuster 3 in accordance with the metric data from the metric value accumulator 7, discriminates the erase flag of each of the symbols which has a smaller metric value than a predetermined value from the other erase flag carrying symbols and delivers data about the location of true error symbols to the column code decoder 4. In other words, it eliminates the erase flags of the false error symbols which have greater metric values than the predetermined value. The erase flag adjuster 3 may be identical to that of the first embodiment. The column code decoder 4 when receiving the digital data from the row code decoder 2 and the erase flag data from the erase flag adjuster 3 performs decoding of the mxk data with u-tuple error correction and v-tuple erase correction routines (where both u and v are integers) and produces an lxk array code of digital form.

According to the second embodiment, a metric value accumulator is provided for calculating the metric value of each symbol of a row code from the data output of a Viterbi decoder and an erase flag adjuster which in accordance with data from the metric value accumulator, accepts the erase flag carried on each of the error symbols which has a lower metric value than a predetermined value while the erase flags have been set up by a row code decoder. Hence, most of true error symbols which are not corrected by a column code decoder in the prior art will be corrected, thus minimizing the error rate. When decoding is carried out by the Viterbi decoding method, the reliability of a received signal can be examined by the Viterbi decoder. Although the second embodiment is a playback device, it may successfully be provided in the form of a transmitter while the recording medium is replaced by a transmission line.

What is claimed is:

1. A digital signal decoder comprising:
    a signal detector for producing a digital signal through detecting a waveform of coded data supplied from a transmission line in the form of an m rows by n columns matrix code, (where m and n are integers), which has been converted by row and column encoding procedures from two-dimensional lxk array data, (where l and k are integers);
    a row code decoder for decoding row code portions of the digital signal of two dimensional code data supplied from the signal detector by means of t-tuple error correction and s-tuple error detection routines so as to produce mxk array data and if any symbol in each row exhibits errors, assigning an erase flag to the symbol;
    a received symbol reliability detector for calculating the reliability of each erase flag carrying symbol of the row codes produced by the row code decoder, with reference to a data signal about the reliability of the digital data supplied from the signal detector, and for producing a symbol reliability output;
    an erase flag adjuster for, upon receiving the erase flag data from the row code decoder and the symbol reliability from the received symbol reliability detector, accepting the erase flags of error symbols which have lower reliability values than a predetermined reference value; and
    a column code decoder for, upon receiving the digital data from the row code decoder and the erase flag data from the erase flag decoder, decoding column code portions of the data by means of u-tuple error correction and v-tuple error correction routines so as to reproduce lxk array data.

* * * * *